(12) United States Patent
Koehl et al.

(10) Patent No.: US 7,340,143 B2
(45) Date of Patent: Mar. 4, 2008

(54) SEMICONDUCTOR RAMAN VARIABLE OPTICAL ATTENUATOR/AMPLIFIER AND EQUALIZER

(75) Inventors: Sean M. Koehl, Los Gatos, CA (US); Richard Jones, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/337,214

(22) Filed: Jan. 20, 2006

(65) Prior Publication Data

US 2007/0172189 A1 Jul. 26, 2007

(51) Int. Cl.
G02B 6/12 (2006.01)

(52) U.S. Cl. .................. 385/131; 385/140; 385/14; 372/3

(58) Field of Classification Search ............... None
See application file for complete search history.

(56) References Cited

U.S. PATENT DOCUMENTS

| | | | |
|---|---|---|---|
| 4,786,129 | A | 11/1988 | Webb |
| 5,754,714 | A | 5/1998 | Suzuki et al. |
| 5,920,666 | A | 7/1999 | Digonnet et al. |
| 6,563,627 | B2 | 5/2003 | Yoo |
| 6,674,773 | B1 | 1/2004 | Cotteverte et al. |
| 6,999,670 | B1 | 2/2006 | Gunn, III et al. |
| 2004/0090661 | A1 | 5/2004 | Nicolaescu |
| 2005/0265679 | A1* | 12/2005 | Liu et al. .............. 385/131 |
| 2006/0159382 | A1* | 7/2006 | Rong ................. 385/1 |

FOREIGN PATENT DOCUMENTS

| WO | WO 2006/028621 A2 | 3/2006 |
|---|---|---|
| WO | WO 2006/063348 A1 | 6/2006 |
| WO | PCT/US2005/027631 | 9/2006 |

OTHER PUBLICATIONS

Mizunami T. et al., "Short-Wavelength Stimulated Raman Scattering in a Silica Fiber Pumped by an XeBr Excimer Laser," IEEE Journal of Quantum Electronics, vol. 25, No. 8, pp. 1917-1920, Aug. 1, 1989.
Claps R. et al., "Observation of stimulated Raman amplification in silicon waveguides," Optics Express, vol. 11, No. 15, pp. 1731-1739, Jul. 28, 2003.
Rong H. et al., "An All-silicon Raman laser," NATURE, vol. 433, No. 7023, pp. 292-294, Jan. 20, 2005.

* cited by examiner

*Primary Examiner*—Sarah Song
(74) *Attorney, Agent, or Firm*—Blakely, Sokoloff, Taylor & Zafman LLP

(57) ABSTRACT

A semiconductor-based optical amplifier/attenuator is disclosed. An apparatus according to aspects of the present invention includes an optical waveguide disposed in semiconductor material. A first optical beam having a first wavelength is to be directed through the optical waveguide. The optical waveguide is optically coupled to receive a pump optical beam having a pump wavelength. The pump optical beam also has a power level sufficient to amplify the first optical beam via stimulated Raman scattering (SRS) in the optical waveguide. A diode structure is disposed in the optical waveguide. The diode structure coupled is to be selectively biased to selectively control free carrier lifetimes of the free carriers in the optical waveguide. This enables to selective amplification or attenuation of the first optical beam output from the optical waveguide.

19 Claims, 4 Drawing Sheets

SEMICONDUCTOR RAMAN VARIABLE OPTICAL ATTENUATOR/AMPLIFIER AND EQUALIZER

BACKGROUND OF THE INVENTION

1. Field of the Invention

Embodiments of invention relate generally to optical devices and, more specifically but not exclusively relate to amplifying and/or attenuating optical power in optical beams.

2. Background Information

The need for fast and efficient optical-based technologies is increasing as Internet data traffic growth rate is overtaking voice traffic pushing the need for fiber optical communications. Transmission of multiple optical channels over the same fiber in the dense wavelength-division multiplexing (DWDM) system provides a simple way to use the unprecedented capacity (signal bandwidth) offered by fiber optics. Commonly used optical components in the system include wavelength division multiplexed (WDM) transmitters and receivers, optical filter such as diffraction gratings, thin-film filters, fiber Bragg gratings, arrayed-waveguide gratings, optical add/drop multiplexers, optical amplifiers and optical attenuators.

An optical amplifier is a device that can be used to increase the optical intensity or power of an optical beam while an optical power attenuator is a device that can be used to limit the intensity of light transmitted by the device to some value. An optical amplifier can be useful to for example increase the intensity of an optical beam to compensate for power loss before or after being transmitted from a source to a destination. Optical power attenuators can be useful for a number of purposes including protecting human eyes, photodetectors or the like from high intensity light. Known optical power attenuators include solid-state optical power attenuators based on photoconductivity and the electro-optic effect has been observed in electro-optic crystals. Other known materials used for optical power limiting include molecular materials such as matallophthalocyanines and metallonaphthalocyanines, which exhibit relatively low linear absorption and high ratios of exited-state to ground-state absorption. Christiansen filters have also been utilized in optical power attenuator applications to limit the maximum power transmitted by a device to some fixed value. Christiansen filters include for example small grains of crushed glass mixed with a liquid exhibiting a precise linear refractive index such that the glass grains disappear into the host liquid. An index mismatch between the liquid and glass components is induced by exposure to high intensity light, which therefore results in the optical power attenuator behavior in the device. Use of the known optical power attenuators such as those summarized above has been limited due to their complexity and the challenges involved with integrating and combining these technologies with other optical technologies into practical solutions.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Methods and apparatuses for amplifying and attenuating optical beams are disclosed. In the following description numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. In addition, it is appreciated that the figures provided herewith are for explanation purposes to persons ordinarily skilled in the art and that the drawings are not necessarily drawn to scale.

Figure 1:
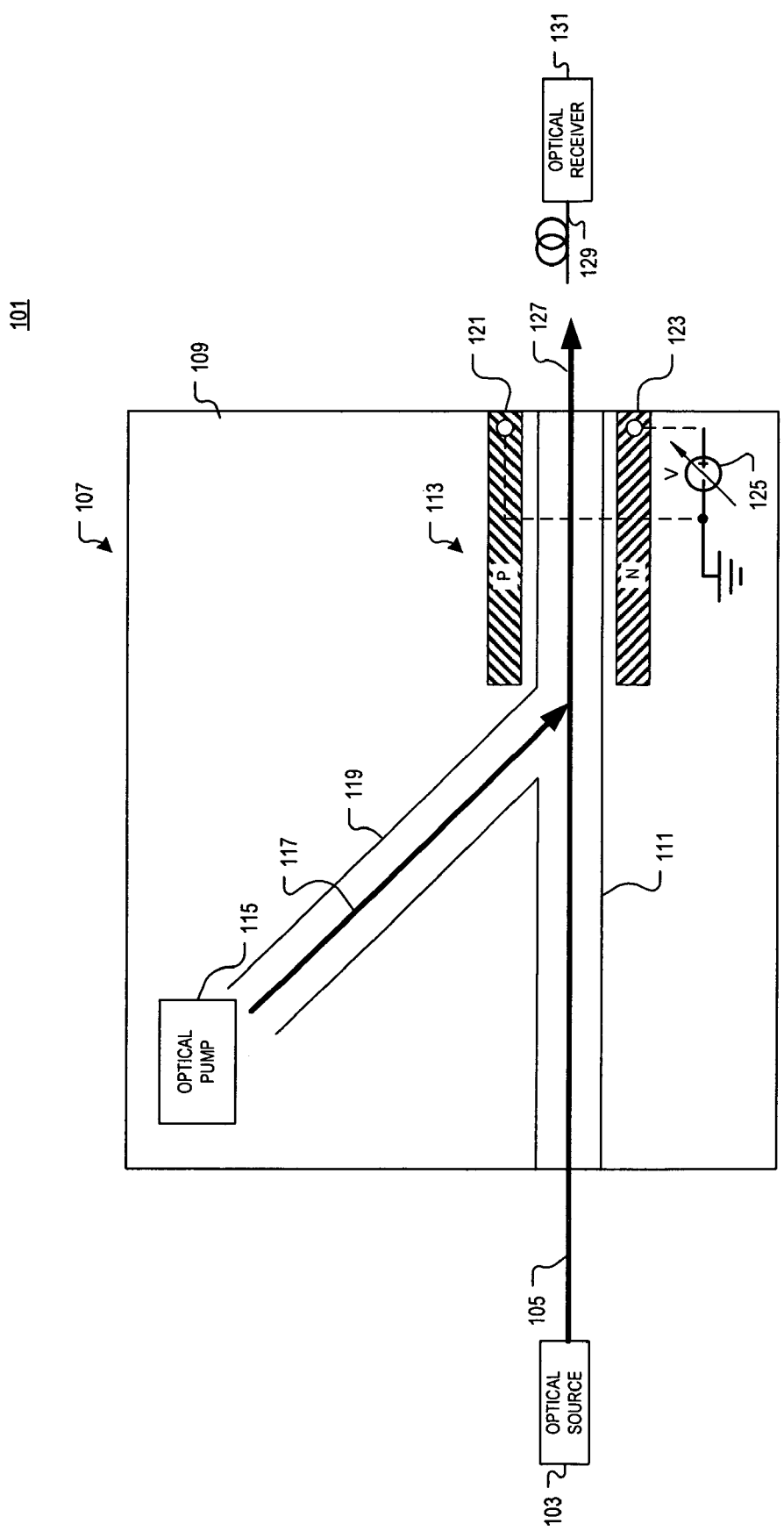
FIG. 1 is a block diagram illustrating an optical system including an example of a semiconductor-based variable optical amplifier and attenuator in accordance with the teachings of the present invention.

FIG. 1 illustrates generally a system including an optical source coupled to transmit an optical beam to an optical receiver through an example of an optical device 107 in accordance with the teachings of the present invention. In particular, FIG. 1 shows system 101 including optical source 103 directing optical beam 105 to an optical device 107. In the illustrated example, optical device 107 is a semiconductor-based variable optical amplifier and attenuator in accordance with the teachings of the present invention. As will be discussed, optical beam 105 is attenuated and/or amplified such that the resultant output optical beam, which is labeled optical beam 127 in FIG. 1, is transmitted from optical device 107 to an optical receiver 131. In one example, output optical beam 127 is transmitted through a standard optical fiber 129 from optical device 107 to optical receiver 131. For efficient operation, one of a variety of mode couplers such as for example tapers or the like in the semiconductor material 109 of optical device 107 may be employed to optically couple optical device 107 to optical fiber 129.

As shown in FIG. 1, optical device 107 includes an optical waveguide 111 disposed in the semiconductor material 109 that is optically coupled to receive optical beam 105. In one example, semiconductor material 109 includes silicon and optical beam has a first wavelength of $\lambda_S$, which includes infrared (IR) or near infrared (NIR) light. Optical waveguide 111 is etched in the semiconductor material 109, which is integrated with a PIN diode structure 113. As will be discussed, optical waveguide 111 is optimized for low propagation loss and high optical power density to allow for efficient simulated Raman Scattering (SRS). The PIN diode structure 113 is used to selectively control the removal of free carriers from optical waveguide 111 and therefore the amount of amplification or attenuation in accordance with the teachings of the present invention.

With respect to the simulated Raman scattering, the example illustrated in FIG. 1 shows that optical waveguide 111 is optically coupled to receive a pump optical beam 117 from an optical pump 115 through an optical waveguide 119 disposed in the semiconductor material 109. In the illustrated example, the pump optical beam 117 has a pump wavelength $\lambda_P$, which in one embodiment is a different wavelength than first wavelength $\lambda_S$. The relationship in wavelength is determined by the material properties. For example, in one example, semiconductor material 109 includes silicon and pump wavelength $\lambda_P$ is a lower wavelength than first wavelength $\lambda_S$. In one example, pump optical beam 117 has a sufficient pump power level to amplify optical beam 105 in optical waveguide 111 in through stimulated Raman scattering (SRS). In various examples, optical waveguide 111 may be optically coupled to receive pump optical beam 117 in a variety of different manners such as for example through a waveguide coupler or an optical coupler, or for example as light incident on optical waveguide 111. Therefore, optical pump beam 117 induces optical amplification of the optical beam 105 with SRS in accordance with the teachings of the present invention.

As shown in the illustrated example, the PIN diode structure 113 includes a P region 121 and an N region 123 disposed along either side of the optical waveguide 111. The diode structure is coupled to a variable voltage source 125 to be selectively biased to selectively control the lifetime of the free carriers or the concentration of free carriers in the optical waveguide 111 to control the optical power of the beam when output from optical waveguide 111. For example, free carriers may be generated in silicon as a result of two-photon absorption from the amplification of optical beam 105, which is a third-order nonlinear optical effect. The additional free carriers tend to attenuate the optical power of the optical beam. Therefore, by controlling the number of free carrier along the path of the optical beam along optical waveguide 111, the output power of the resulting output optical beam 127 can be selectively amplified or attenuated in accordance with the teachings of the present invention.

Figure 2:
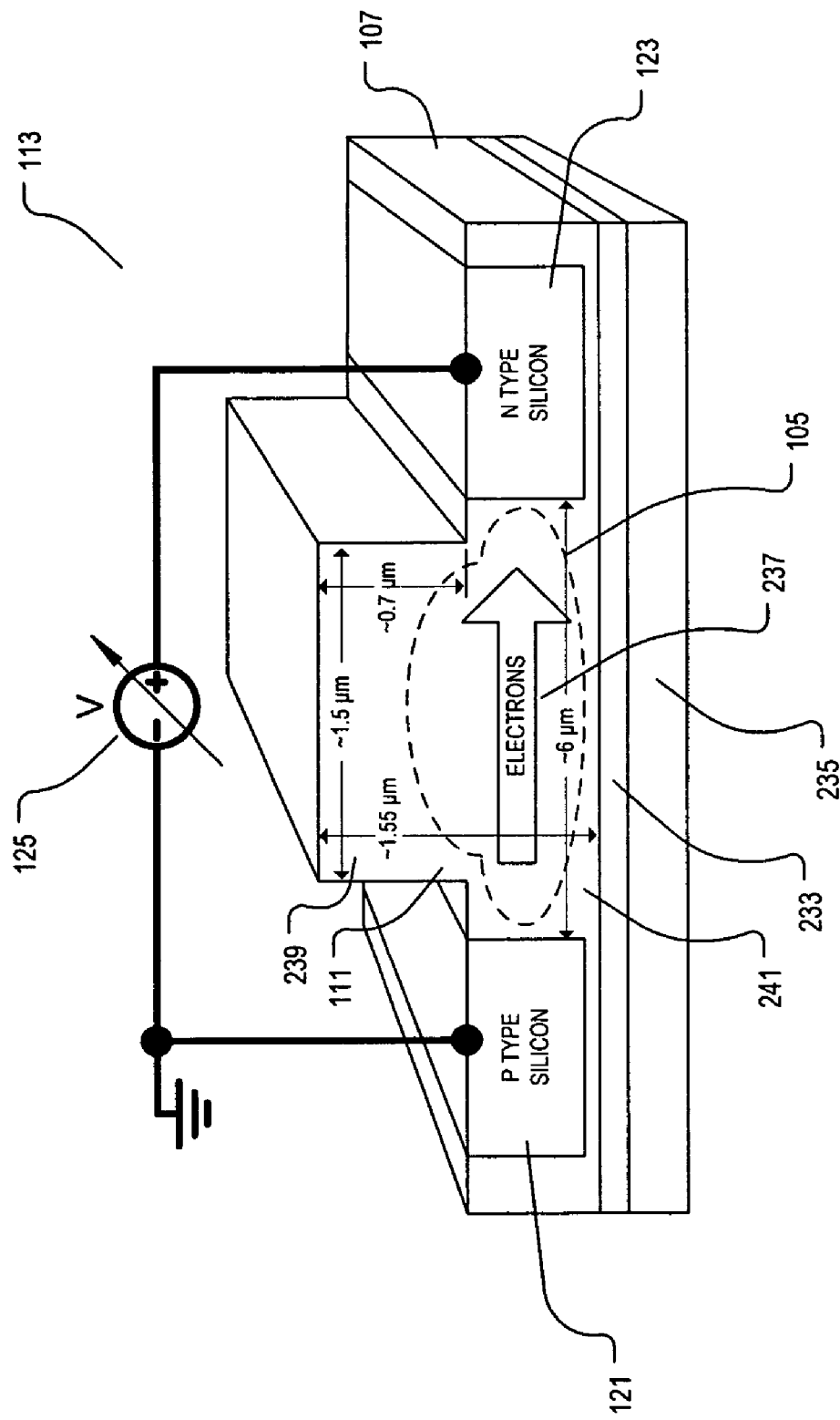
FIG. 2 is a cross section view illustration of semiconductor-based optical waveguide including an example a diode structure to modulate and/or reduce two-photon absorption generated carrier lifetimes in the semiconductor waveguide in accordance with the teachings of the present invention.

FIG. 2 is a diagram showing generally a cross-section view of the optical waveguide 111 though the PIN diode structure 113 in accordance with the teachings of the present invention. As shown in the depicted example, optical waveguide 111 is a rib waveguide including a rib region 239 and a slab region 241. In the illustration, optical beam 105 is shown propagating through the rib waveguide 111. As shown, the intensity distribution of the optical mode of optical beam 105 is such that the majority of the optical beam 105 propagates through a portion of the rib region 239 or a portion of the slab region 241 of optical waveguide 111 towards the interior of the rib waveguide 111. As also shown with the optical mode of optical beam 105, the intensity of the propagating optical mode of optical beam 105 is vanishingly small at the "upper corners" of rib region 239 as well as the "sides" of the slab region of optical waveguide 111.

In the illustrated example, optical waveguide 111 is formed in a silicon-on-insulator (SOI) wafer including the silicon of semiconductor material 109, a silicon substrate layer 235 and a buried oxide layer 233 disposed between the silicon of semiconductor material 109 and silicon substrate layer 235.

In the example shown in FIG. 2, P region 121 and N region 123 of the diode structure 113 disposed in optical waveguide 111 are disposed at opposite lateral sides of the slab region 241 in the optical waveguide 111, outside of the optical mode of optical beam 105. As shown, diode structure 113 is a PIN diode structure, which includes P doped silicon in P region 121, intrinsic silicon in semiconductor material 109 and N doped silicon in N region 123. In the illustrated example, the optical mode of optical beam 105 propagates through the intrinsic silicon in semiconductor material 109 of the PIN diode structure 113.

The example shown in FIG. 2 shows variable voltage source 125 is illustrated as being coupled between P region 121 and N region 123. P region 121 is also grounded and variable voltage source 125 is coupled to apply an adjustable voltage between P region 121 and N region 123 to bias the diode structure 113 in accordance with the teachings of the present invention. For example, when reverse biasing the diode structure 113 as shown, an electric field is created between the P region 121 and N region 123 to sweep free carriers 237, which are electrons and/or holes, from the optical waveguide 111. This sweeping of free carriers from optical waveguide 111 may also be complimented with the injection of free carriers into optical waveguide 111 to control the concentration of free carriers 2376 in optical waveguide 111. By injecting or sweeping out the free carriers 237, as discussed, the free carrier concentrations, lifetimes or the removal of the free carriers 237 can be selectively controlled in accordance with the teachings of the present invention. This enables control of the gain or attenuation of the output power level of the optical beam in accordance with the teachings of the present invention.

As shown, FIG. 2 also provides some dimensions for an example PIN diode structure 113. In the illustrated example, the width of the rib region 239 is approximately 1.5 μm, the height of the rib region 239 is approximately 0.7 μm and the distance between the P region 121 and N region 123 is approximately 6 μm. It is appreciated of course the FIG. 2 is not necessarily drawn to scale and that the example dimensions provided are for explanation purposes and that other dimensions may be utilized in accordance with the teachings of the present invention. For instance, in another example, the etch depth of rib region 239 is increased, which would increase the height of rib region 239. In such an example, the entire mode of optical beam 105 would propagate through region "rib" region 239, which would effectively render rib region 239 of optical waveguide 111 a strip waveguide in accordance with the teachings of the present invention.

Figure 3:
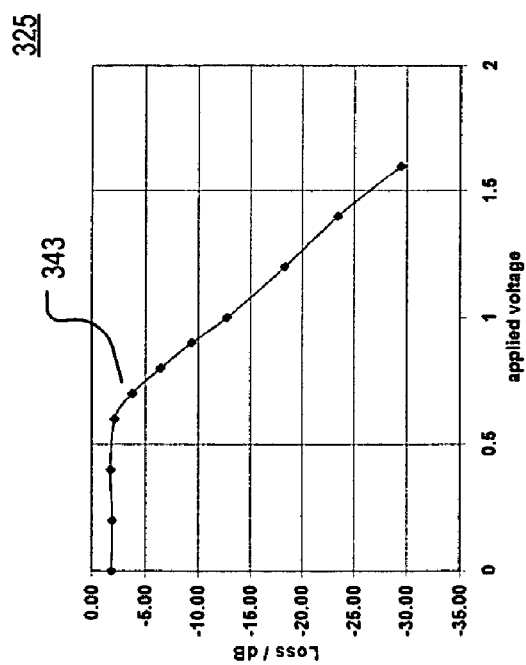
FIG. 3 diagram illustrating a relationship of propagation loss versus a forward bias voltage in an example semiconductor-based variable optical amplifier and attenuator in accordance with the teachings of the present invention.

FIG. 3 diagram 325 illustrating a relationship 343 of propagation loss versus a forward bias voltage in an example semiconductor-based variable optical amplifier and attenuator in accordance with the teachings of the present invention. FIG. 3 shows that the propagation loss of optical waveguide 111 in silicon semiconductor material 109 when a forward bias voltage is placed on the PIN diode structure 113. As shown, the free charge carriers are injected into the optical waveguide 111, which causes additional loss. The relationship 343 shows 30 dB propagation loss when a forward bias voltage of 1.6V is applied.

Figure 4:
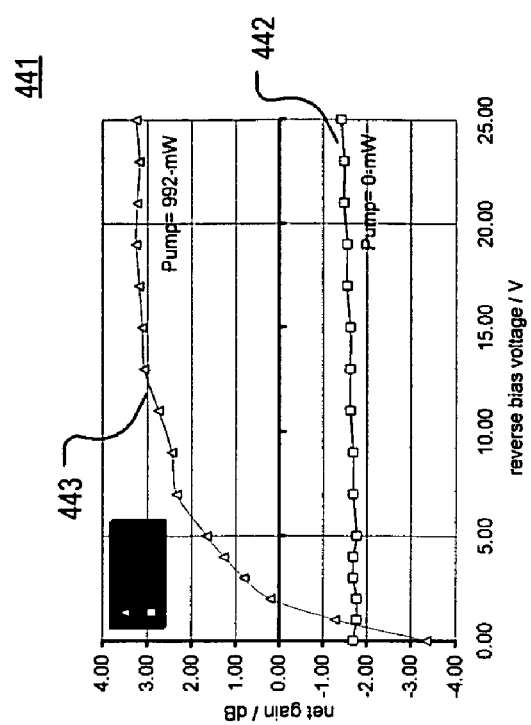
FIG. 4 diagram illustrating a relationship of propagation loss versus a reverse bias voltage at various pump powers in an example semiconductor-based variable optical amplifier and attenuator in accordance with the teachings of the present invention.

FIG. 4 diagram 441 illustrating relationships 442 and 443 of propagation loss versus a reverse bias voltage at approximately 0 W and 1 W pump powers in an example semiconductor-based variable optical amplifier and attenuator in accordance with the teachings of the present invention. In particular, FIG. 4 shows the net gain when the optical waveguide 111 is pumped with approximately 1 W and a reverse bias is applied to the PIN diode structure 113. Here with a 10V reverse bias on the pin 3 dB net gain is achievable. Therefore, by toggling the bias accordingly on the PIN diode structure 113, the propagation loss of the PIN diode structure 113 can be switched from +3 db to −30 dB electrically thereby functioning as a novel optical attenuator or gain element in accordance with the teachings of the present invention in response to the biasing of the PIN diode structure 113.

The data of FIG. 3 and FIG. 4 was taken using a 1.5 μm silicon optical waveguide, such as that illustrated in FIG. 2. It is noted that reducing the dimensions of the optical waveguide, or reducing the channel length, i.e. distance between the P and N regions, allows similar device performance at a reduced voltage with constant field scaling and lower optical power using constant pump intensity scaling.

Figure 5:
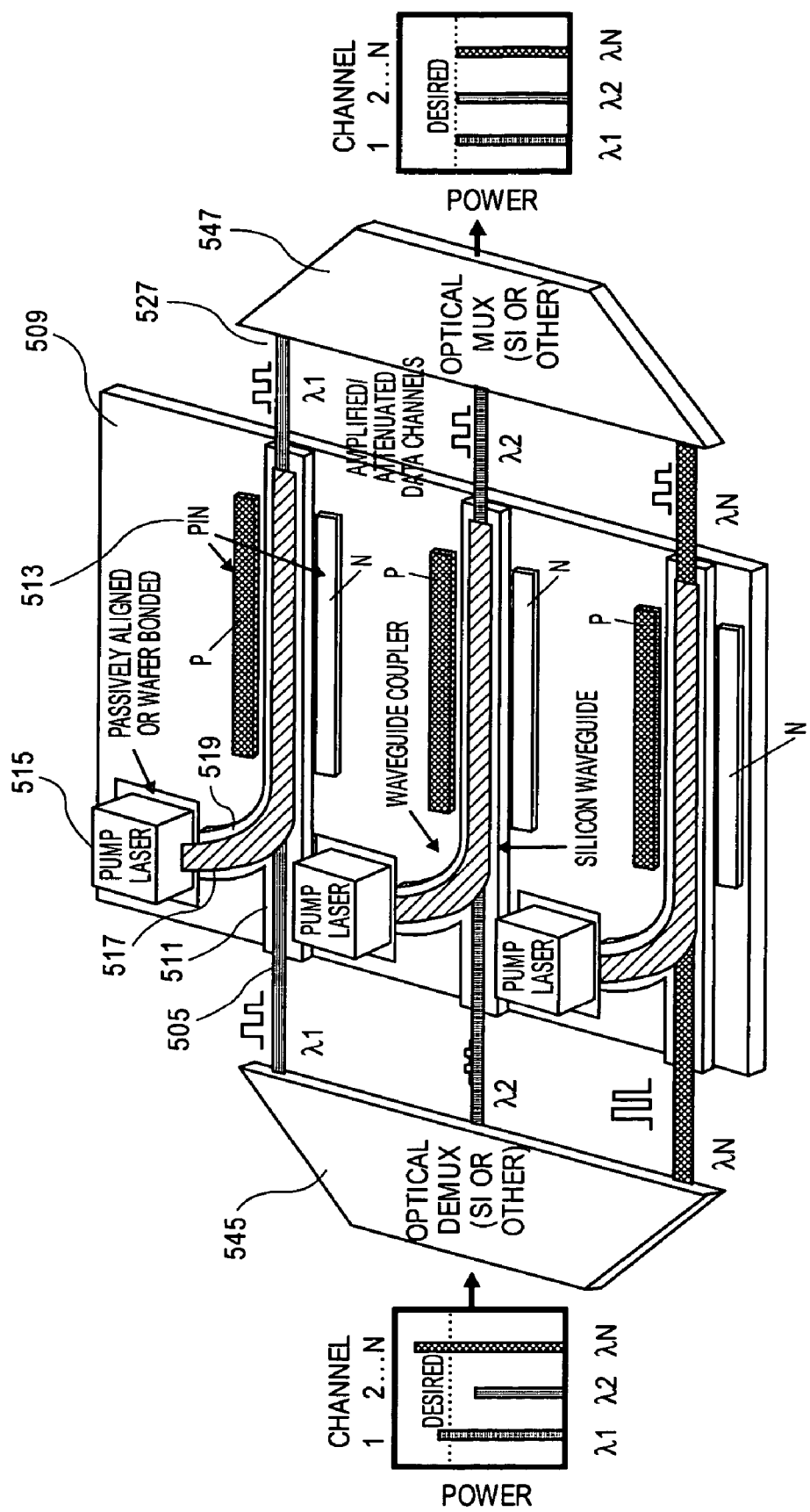
FIG. 5 is a block diagram illustrating an example of a wave division multiplexed optical beam having multiple channels with different optical powers that are equalized by amplification/attenuation to a desired optical power using an example semiconductor-based variable optical amplifier and attenuator in accordance with the teachings of the present invention.

FIG. 5 is a block diagram illustrating an example of a wave division multiplexed (WDM) optical beam having multiple channels with different optical powers that are equalized by amplification/ attenuation to a desired optical power using an example semiconductor-based variable optical amplifier and attenuator in accordance with the teachings of the present invention. In particular, FIG. 5 shows that an optical demultiplexer 545 is coupled to receive a WDM optical beam having a plurality of channels on which data is encoded with wavelengths that include $\lambda 1, \lambda 2 \ldots \lambda N$. As shown, the various channels of the WDM optical beam have non-uniform optical power levels. For example, the $\lambda 1$ channel as illustrated has slightly higher optical power than desired, while, the $\lambda 2$ channel has lower than desired optical power and the $\lambda N$ channel is more than desired optical power.

Demultiplexer splits the WDM optical beam into its component optical beam $\lambda 1, \lambda 2, \ldots \lambda N$ channels and directs each separated optical beam into a respective variable optical amplifier/attenuator in semiconductor material 509 in accordance with the teachings of the present invention. For example, the $\lambda 1$ channel, which is labeled optical beam 505 in FIG. 5, is directed into optical waveguide 511, which is etched into semiconductor material 509. In the illustrated example, semiconductor material 509 is silicon.

With optical waveguide 511 is optically coupled to receive a pump optical beam 517 from an optical pump laser 515 through an optical waveguide 519 disposed in the semiconductor material 509. In the illustrated example, the pump optical beam 517 has a pump wavelength $\lambda_P$, which in one embodiment is a different wavelength than first wavelength $\lambda_S$. For example, in one example, pump wavelength $\lambda_P$ is a lower wavelength than first wavelength $\lambda_S$. In one example, pump optical beam 117 at wavelength $\lambda_P$ has a sufficient pump power level to amplify or boost the optical power of optical beam 505 at wavelength $\lambda_S$ in optical waveguide 511 via SRS. In the illustrated example, optical pump laser 515 is passively aligned or wafer bonded to optical waveguide 519 in semiconductor material 509 and optical waveguide 519 is optically coupled to optical waveguide 511 through a waveguide coupler.

In operation, the PIN diode structure 513 is reversed bias accordingly to equalize the optical power levels, which in the case of the $\lambda 1$ channel means attenuating optical beam 505 such that resultant optical beam 527 is equal to the desired optical power. In the case of the $\lambda 2$ channel, the corresponding optical beam is boosted and the optical beam corresponding to the $\lambda N$ channel is attenuated accordingly such that the optical powers of the optical beams are all equalized in accordance with the teachings of the present invention. Therefore, the amplified/attenuated data channels shown in the example of FIG. 5 with the equalized optical beams are all received by optical multiplexer wherein an equalized output WDM optical beam is output from the optical multiplexer 547 in accordance with the teachings of the present invention.

It is noted in the example illustrated in FIG. 5 that optical power levels are all "equalized" to substantially the same optical power or "flat" equalization profile. It is appreciated that in other examples, each of the multiple channels could be selectively "equalized" to different power levels in accordance with the teachings of the present invention. For example, the channels could be "equalized" with each pump laser 515 and PIN diode structure 513 to any equalizer profile of relative intensities. For instance, the optical power output for the various channels could be set to be equal, increase with wavelength, decrease with wavelength, or could be set to any combination thereof in accordance with the teachings of the present invention.

The above description of illustrated embodiments of the invention, including what is described in the Abstract, is not intended to be exhaustive or to be limitation to the precise forms disclosed. While specific embodiments of, and examples for, the invention are described herein for illustrative purposes, various equivalent modifications are possible, as those skilled in the relevant art will recognize. Indeed, it is appreciated that the specific wavelengths, dimensions, materials, times, voltages, power range values, etc., are provided for explanation purposes and that other values may also be employed in other embodiments in accordance with the teachings of the present invention.

These modifications can be made to embodiments of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation.

What is claimed is:

1. An apparatus, comprising:
    an optical waveguide disposed in semiconductor material,
        a first optical beam having a first wavelength to be directed through the optical waveguide, the optical waveguide optically coupled to receive a pump optical beam having a pump wavelength and having a power level sufficient to amplify the first optical beam via stimulated Raman scattering (SRS) in the optical waveguide; and
    a diode structure disposed in the optical waveguide, the diode structure coupled to be selectively biased to selectively control concentration of the free carriers in the optical waveguide to selectively amplify and attenuate the first optical beam output from the optical waveguide.

2. The apparatus of claim 1 further comprising a voltage source coupled to a P region and an N region of the diode structure.

3. The apparatus of claim 2 wherein the voltage source is a variable voltage source to control the optical power of the optical output from the optical waveguide.

4. The apparatus of claim 1 wherein the diode structure comprises a PIN diode disposed in the optical waveguide.

5. The apparatus of claim 1 wherein the diode structure comprises:
a P region disposed on a lateral side of the optical waveguide; and
an N region disposed on an opposite lateral side of the optical waveguide.

6. The apparatus of claim 1 wherein the semiconductor material comprises silicon.

7. The apparatus of claim 1 wherein the optical waveguide comprises a silicon rib waveguide disposed in the semiconductor material.

8. The apparatus of claim 1 wherein the optical waveguide comprises a silicon strip waveguide disposed in the semiconductor material.

9. The apparatus of claim 1 wherein the diode structure is coupled to be selectively biased to inject or sweep out the free carriers from the optical waveguide generated in response to the two-photon absorption occurring in the optical waveguide in response to the optical beam.

10. The apparatus of claim 1 further comprising an optical demultiplexer optically coupled to receive a wave division multiplexed optical beam having a plurality of channels, wherein the first optical beam having the first wavelength is one of a plurality outputs of the optical demultiplexer.

11. The apparatus of claim 10 further comprising an optical multiplexer optically coupled to receive the first optical beam output from the optical waveguide, wherein the first optical beam output from the optical waveguide is one of a plurality inputs of the optical demultiplexer.

12. A method, comprising:
directing a first optical beam having a first wavelength into an optical waveguide defined in a semiconductor material;
amplifying the first optical beam via stimulated Raman scattering (SRS) in the optical waveguide by directing a pump optical beam into the optical waveguide; and
selectively controlling the injection or removal of free carriers from the optical waveguide to control an amount of amplification and attenuation of the optical beam.

13. The method of claim 12 wherein controlling the injection or removal of free carriers from the optical waveguide comprises sweeping out the free carriers from the optical waveguide.

14. The method of claim 12 wherein controlling the injection or removal of free carriers from the optical waveguide comprises biasing a diode structure in the optical waveguide.

15. The method of claim 13 wherein sweeping out the free carriers from the optical waveguide comprises variably reverse biasing a diode structure disposed in the optical waveguide.

16. A system, comprising:
an optical source coupled to transmit a first optical beam having a first wavelength;
an optical receiver coupled to receive the first optical beam from the optical source;
an optical device including:
an optical waveguide disposed in semiconductor material, the first optical beam to be received from the optical source and directed through the optical waveguide, the optical waveguide optically coupled to receive a pump optical beam having a pump wavelength and having a power level sufficient to amplify the first optical beam via stimulated Raman scattering (SRS) in the optical waveguide; and
a diode structure disposed in the optical waveguide, the diode structure coupled to be selectively biased to selectively control concentration of the free carriers in the optical waveguide to selectively amplify and attenuate the first optical beam output from the optical waveguide; and
an optical fiber optically coupled between the optical device and the optical receiver.

17. The system of claim 16 further comprising a variable voltage source coupled to a P region and an N region of the diode structure.

18. The system of claim 16 wherein the semiconductor material comprises silicon.

19. The system of claim 16 wherein the diode structure is coupled to be selectively biased to control the removal of the free carriers from the optical waveguide.

* * * * *